United States Patent
Li et al.

(10) Patent No.: US 10,765,013 B2
(45) Date of Patent: Sep. 1, 2020

(54) METHOD FOR MANUFACTURING RIGID-FLEXIBLE CIRCUIT BOARD

(71) Applicants: Avary Holding (Shenzhen) Co., Limited., Shenzhen (CN); HongQiSheng Precision Electronics (QuiHuangDao) Co., Ltd., Qinhuangdao (CN)

(72) Inventors: Biao Li, Shenzhen (CN); Wei-Xiang Li, Shenzhen (CN); Peng He, Shenzhen (CN); Mei-Hua Huang, Shenzhen (CN); Xiao-Wei Kang, Shenzhen (CN); Meng-Lu Jia, Shenzhen (CN)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 301 days.

(21) Appl. No.: 16/021,258

(22) Filed: Jun. 28, 2018

(65) Prior Publication Data
US 2019/0069418 A1 Feb. 28, 2019

(30) Foreign Application Priority Data
Aug. 31, 2017 (CN) .......................... 2017 1 0775216

(51) Int. Cl.
*H05K 3/02* (2006.01)
*H05K 3/10* (2006.01)
(Continued)

(52) U.S. Cl.
CPC .......... *H05K 3/4691* (2013.01); *H05K 1/028* (2013.01); *H05K 9/0081* (2013.01);
(Continued)

(58) Field of Classification Search
CPC .... H05K 3/4691; H05K 1/028; H05K 9/0081; H05K 3/4626; H05K 3/3452;
(Continued)

(56) References Cited

U.S. PATENT DOCUMENTS 5,142,448 A * 8/1992 Kober .................. H05K 3/4691
29/846
5,629,497 A * 5/1997 Sato ...................... H05K 3/4691
174/254
(Continued)

*Primary Examiner* — Donghai D Nguyen
(74) *Attorney, Agent, or Firm* — ScienBiziP, P.C.

(57) ABSTRACT

A method for manufacturing rigid-flexible circuit board includes the step of providing an adhesive sheet defining at least one first opening, a copper foil, and a flexible board. The flexible board comprises a mounting region and a folding region. A removable sheet is pressed on a pressed surface of the adhesive sheet corresponding to each first opening. The copper foil, the adhesive sheet with the removable sheet, and the flexible board are pressed together in that sequence. The removable sheet corresponds to the folding region, and is embedded in the adhesive sheet. The copper foil contacts with the pressed surface and the removable sheet. An interspace is formed between the removable sheet and the flexible board. An outer conductive layer is formed on the copper foil. A removing region of the outer conductive layer corresponding to the folding region and the removable sheet is removed.

10 Claims, 5 Drawing Sheets

(51) Int. Cl.
*H05K 3/46* (2006.01)
*H05K 1/02* (2006.01)
*H05K 9/00* (2006.01)
*H05K 3/34* (2006.01)

(52) U.S. Cl.
CPC ... *H05K 3/3452* (2013.01); *H05K 2201/0355* (2013.01); *H05K 2201/09127* (2013.01); *Y10T 29/49124* (2015.01)

(58) Field of Classification Search
CPC . H05K 2201/0355; H05K 2201/09127; H05K 2201/042; Y10T 29/49124; Y10T 29/49155
USPC .......................................... 29/825, 829, 846
See application file for complete search history.

(56) References Cited

U.S. PATENT DOCUMENTS 7,238,891 B2 * 7/2007 Muenzberg .......... H05K 3/4691
174/254
8,188,372 B2 * 5/2012 Sato ..................... H05K 3/4652
29/846

* cited by examiner

METHOD FOR MANUFACTURING RIGID-FLEXIBLE CIRCUIT BOARD

FIELD

The subject matter herein generally relates to a method for manufacturing a rigid-flexible circuit board.

BACKGROUND

A rigid-flexible circuit board comprises at least one rigid region and at least one flexible region, to cause the circuit board to be durable and soft at the same time. However, the adhesive layer will be residual when an opening is defined corresponding to the flexible region.

Therefore, there is room for improvement within the art.

BRIEF DESCRIPTION OF THE DRAWINGS

Implementations of the present technology will now be described, by way of example only, with reference to the attached figures.

DETAILED DESCRIPTION

Figure 1:
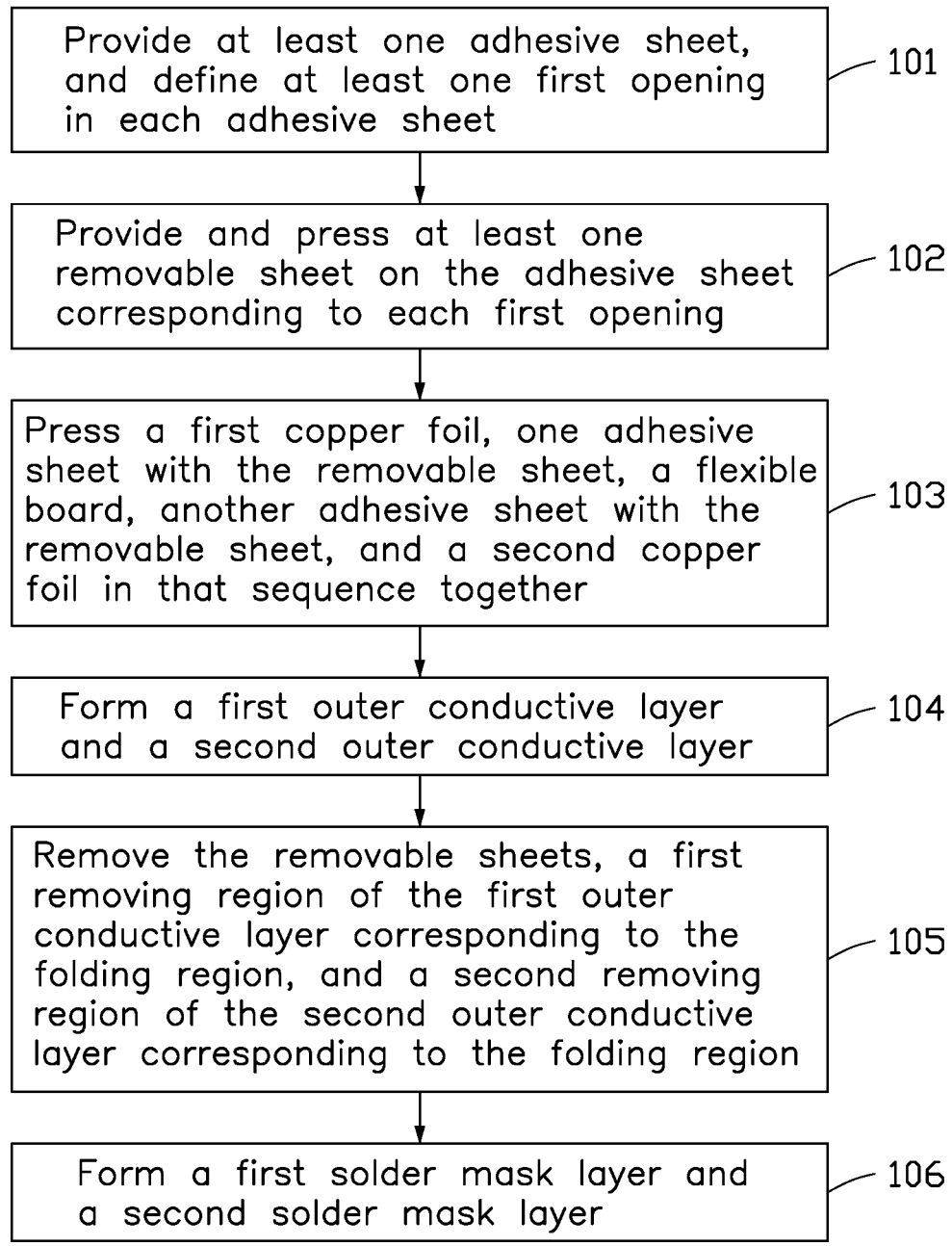
FIG. 1 is a flowchart of an embodiment of a method for manufacturing a rigid-flexible circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "comprising" when utilized, means "including, but not necessarily limited to"; it specifically indicates open-ended inclusion or membership in the so-described combination, group, series and the like.

FIG. 1 illustrates a flowchart is presented in accordance with an embodiment. The method for manufacturing a rigid-flexible circuit board 100 (shown in FIG. 7) is provided by way of example only, as there are a variety of ways to carry out the method. Each block shown in FIG. 1 represents one or more processes, methods, or subroutines, carried out in the method. Furthermore, the illustrated order of blocks is by example only and the order of the blocks can be changed. Additional blocks may be added or fewer blocks may be utilized, without departing from this disclosure. The method can begin at block 101.

Figure 2:
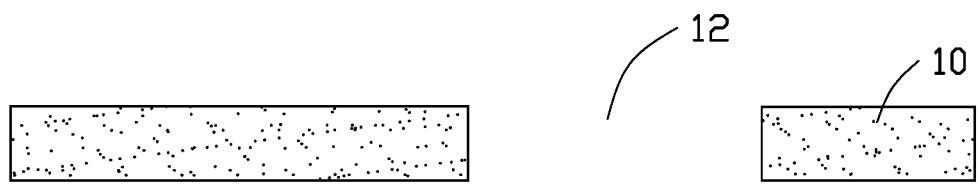
FIG. 2 is a cross-sectional view showing at least one first opening being defined in an adhesive sheet used in the method of FIG. 1.

At block 101, referring to FIG. 2, at least one adhesive sheet 10 is provided, and at least one first opening 12 is defined in each adhesive sheet 10. Each first opening 12 passes through the adhesive sheet 10.

In at least one embodiment, each adhesive sheet 10 is a fiberglass-reinforced semi-cured adhesive sheet. The semi-cured adhesive sheet can be a polypropylene sheet or an epoxy sheet reinforced with fiberglass.

Each first opening 12 is defined by mechanical cutting, laser cutting, or punching.

In this embodiment, two adhesive sheets 10 are provided, and one first opening 12 is defined in each adhesive sheet 10.

Figure 3:
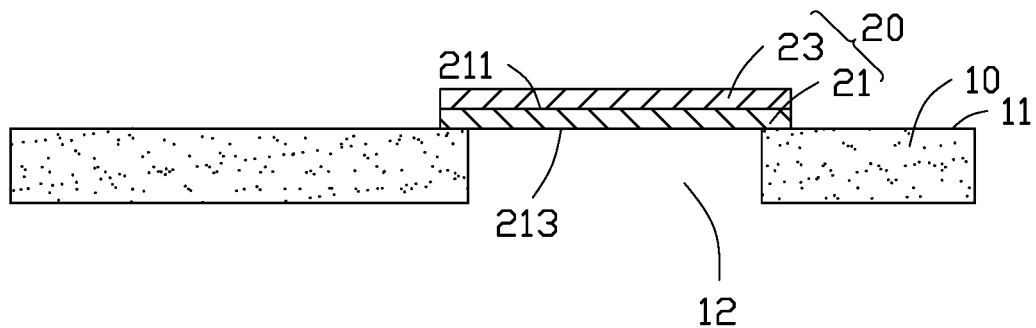
FIG. 3 is a cross-sectional view showing a removable sheet being pressed on the adhesive sheet of FIG. 2.

At block 102, referring to FIG. 3, at least one removable sheet 20 is provided, and each removable sheet 20 is pressed on a pressed surface 11 of each adhesive sheet 10 corresponding to each first opening 12. The removable sheet 20 thus covers the first opening 12. In at least one embodiment, a thickness of each removable sheet 20 is less than a thickness of the adhesive sheet 10.

Each removable film 20 comprises a plastic base 21 and an adhesive film 23 formed on a first surface 211 of the plastic base 21. A second surface 213 of the plastic base 21, facing away from the adhesive film 23, contacts the adhesive sheet 10.

In at least one embodiment, the plastic base 21 is made of polyimide. The removable sheet 20 and the adhesive sheet 10 are pressed together in an environment having a temperature of 70 degrees Celsius, so the removable sheet 20 can be more easily removed from the adhesive sheet 10 without residue remaining. In another embodiment, the plastic base 21 may be made of polyethylene terephthalate or polyethylene naphthalate. A temperature for pressing the removable sheet 20 and the adhesive sheet 10 together can vary according to need.

In at least one embodiment, a shortest distance between a periphery of each removable sheet 20 and an inner wall of the corresponding first opening 12 is about 0.5 mm. In another embodiment, the distance can vary according to need.

Figure 4:
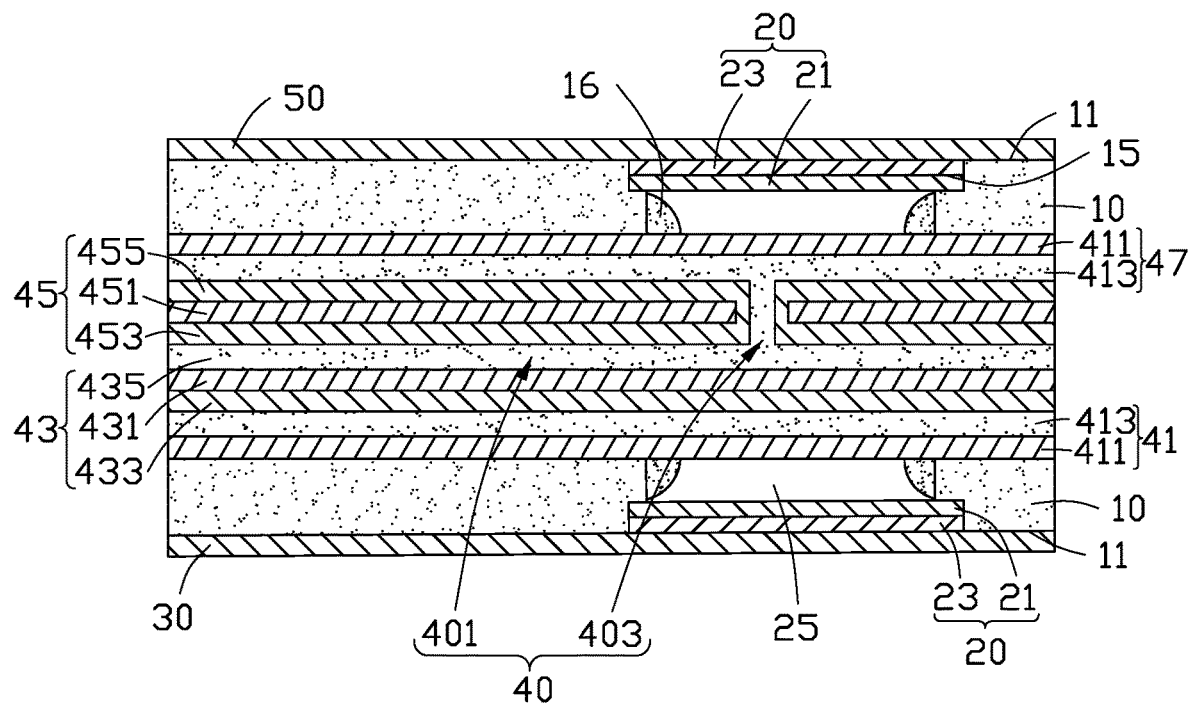
FIG. 4 is a cross-sectional view showing a first copper foil, two adhesive sheets each with the removable sheet, a flexible board, and a second copper foil being pressed together.

At block 103, referring to FIG. 4, a first copper foil 30, one adhesive sheet 10 with the removable sheet 20, a flexible board 40, another adhesive sheet 10 with the removable sheet 20, and a second copper foil 50 are pressed together in that sequence. The flexible board 40 comprises a mounting region 401 and a folding region 403 connected to each other. The at least one removable sheet 20 corresponds to the folding region 403. The first copper foil 30 or the second copper foil 50 is connected to the pressed surface 11 of the adjacent adhesive sheet 10. The removable sheet 20 is embedded in the corresponding adhesive sheet 10, to cause an area of the adhesive sheet 10 contacting with the removable sheet 20 to concave to form a step 15. When pressing, the adhesive sheet 10 is softened and flows from the step 15 to a center of the first opening 12 to form an extending portion 16. Since the thickness of each removable sheet 20 is less than the thickness of the adhesive sheet 10, an interspace 25 is formed between the removable sheet 20 and the flexible board 40.

In at least one embodiment, an extending length of the extending portion 16 is less than 1.5 mm. In another embodiment, the extending length of the extending portion 16 can vary according to need.

In at least one embodiment, the flexible board 40 comprises a first covering film 41, a first copper clad laminate 43, a second copper clad laminate 45, and a second covering film 47 arranged in that sequence.

The first copper clad laminate 43 comprises a first insulating layer 431, a first inner conductive layer 433 connected to a third surface of the first insulating layer 431, and a first adhesive layer 435 connected to a fourth surface of the first insulating layer 431 facing away from the third surface.

The second copper clad laminate 45 comprises a second insulating layer 451, a second inner conductive layer 453 connected to a fifth surface of the second insulating layer 451, and a third inner conductive layer 455 connected to a sixth surface of the second insulating layer 451 facing away from the fifth surface. The second inner conductive layer 453 is electrically connected to the third inner conductive layer 455. In at least one embodiment, the second copper clad laminate 45 further comprises at least one conductive hole. The second inner conductive layer 453 is electrically connected to the third inner conductive layer 455 by means of the conductive hole.

A seventh surface of the first adhesive layer 435 facing away from the first inner conductive layer 433 is connected to an eighth surface of the second inner conductive layer 453 facing away from the second insulating layer 451.

The first covering film 41 and the second covering film 47 each comprises a third insulating layer 411 and a second adhesive layer 413 formed on a ninth surface of the third insulating layer 411. The second adhesive layer 413 of the first covering film 41 is connected to the first inner conductive layer 433, and the second adhesive layer 413 of the second covering film 47 is connected to the third inner conductive layer 455. Each third insulating layer 411 is connected to the corresponding adhesive sheet 10.

The first insulating layer 431, the second insulating layer 451, and the third insulating layer 411 each can be made of a material selected from a group consist of polyimide, teflon, polyamide, methyl methacrylate polymer, polycarbonate, Poly(ethylene terephthalate), polyamide polyethylene-terephthalate copolymer, and any combination thereof. In at least one embodiment, the first insulating layer 431, the second insulating layer 451, and the third insulating layer 411 are each made of polyimide.

In another embodiment, the flexible board 40 may be a double-sided board, a single-sided board, or multilayer board.

Figure 5:
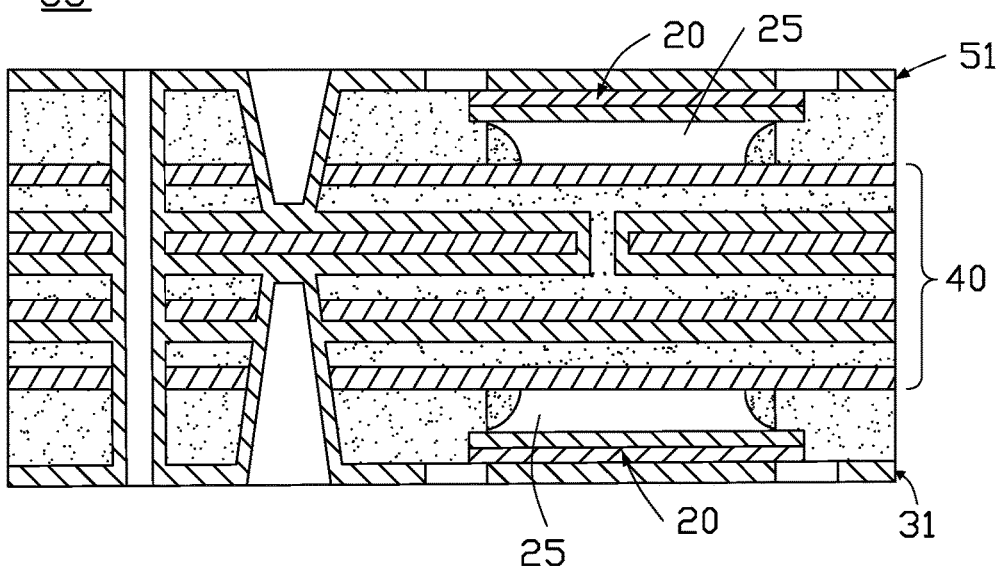
FIG. 5 is a cross-sectional view showing a first outer conductive layer and a second outer conductive layer being formed by the first copper foil and the second copper foil, respectively.

At block 104, referring to FIG. 5, a first outer conductive layer 31 is formed by the first copper foil 30 (shown in FIG. 4), and a second outer conductive layer 51 is formed by the second copper foil 50 (shown in FIG. 4). At least one conductive hole is formed to electrically connecting the first outer conductive layer 31, the second outer conductive layer 51, and the flexible board 40, thereby obtaining a middle structure 63.

Figure 6:
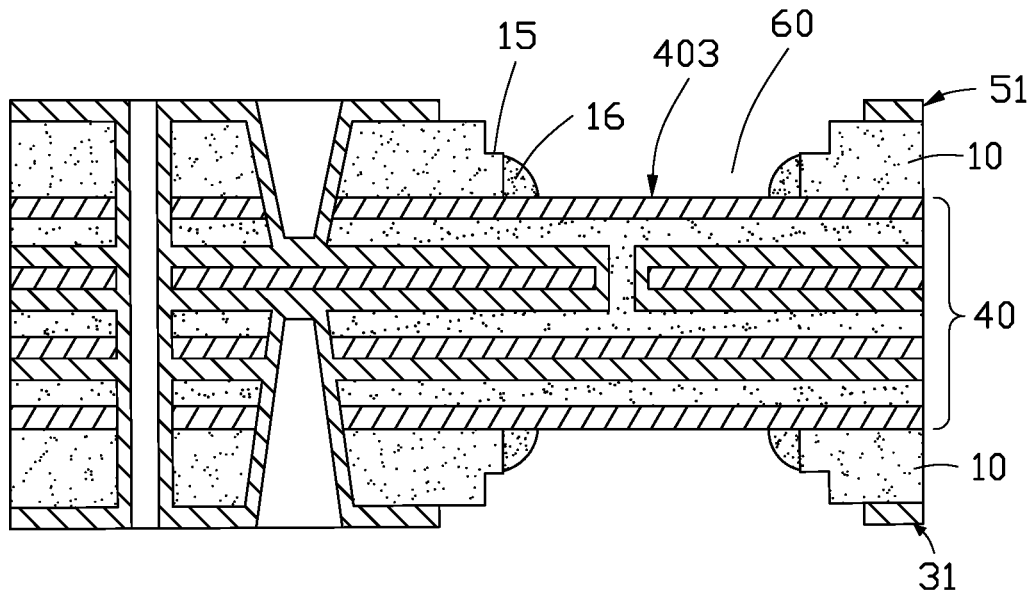
FIG. 6 is a cross-sectional view of showing the removable sheets and regions of the first and second outer conductive layers corresponding to the removable sheets removed.

At block 105, referring to FIG. 6, the removable sheets 20 (shown in FIG. 5), a first removing region of the first outer conductive layer 31 corresponding to the folding region 403, and a second removing region of the second outer conductive layer 51 corresponding to the folding region 403 are removed from the middle structure 63, thereby defining two second openings 60 to expose the folding region 403 and the step 15. Because the interspace 25 (shown in FIG. 5) is between the removable sheets 20 and the flexible board 40, and a contact area of the removable sheets 20 and the adhesive sheet 10 is small, the removable sheets 20 can be removed easily and without residue remaining. Further, the removable sheets 20 are not in contact with the flexible board 40, thereby preventing the first outer conductive layer 31 and the second outer conductive layer 51 from damage when the removable sheets 20 is removed.

In at least one embodiment, the two second openings 60 are defined by using a laser to cut and removing the first outer conductive layer 31, the second outer conductive layer 51, and the adhesive sheets 10 along the periphery of each removable sheet 20.

In another embodiment, the two second openings 60 can be defined by mechanical cutting and then removing the first outer conductive layer 31, the second outer conductive layer 51, and the adhesive sheets 10 along the periphery of each removable sheet 20.

Figure 7:
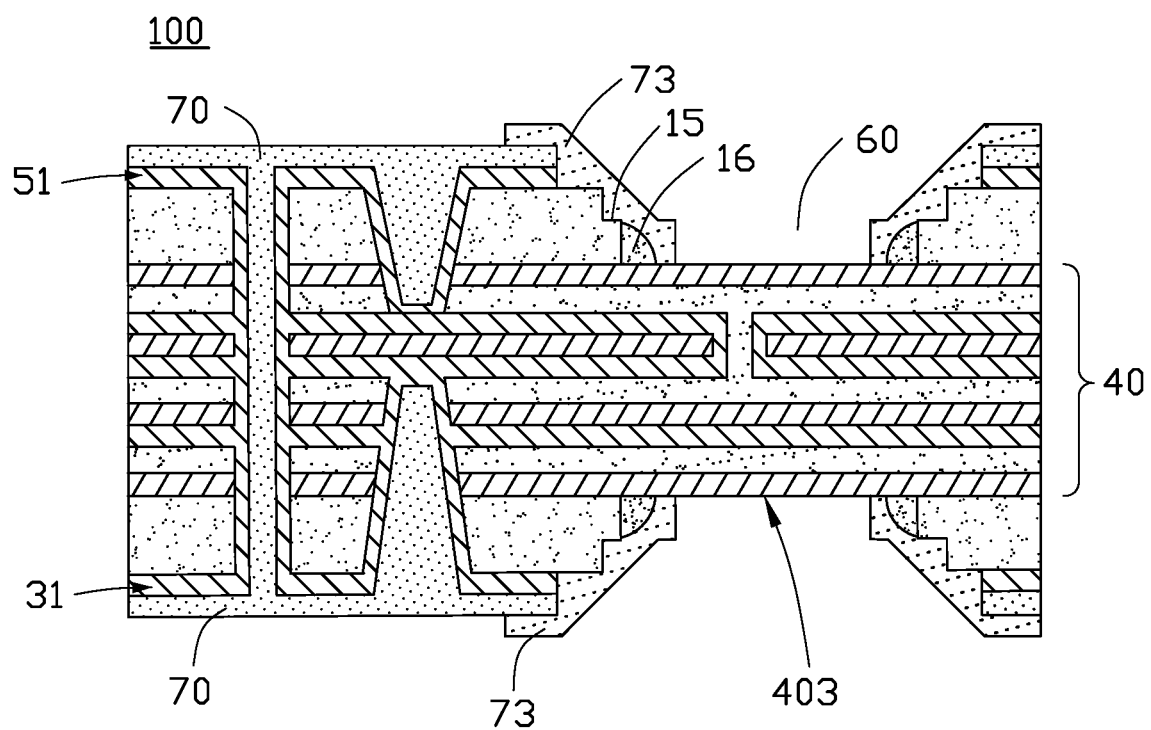
FIG. 7 is a cross-sectional view showing solder mask layers and electromagnetic interference shielding layers being formed.
Figure 8:
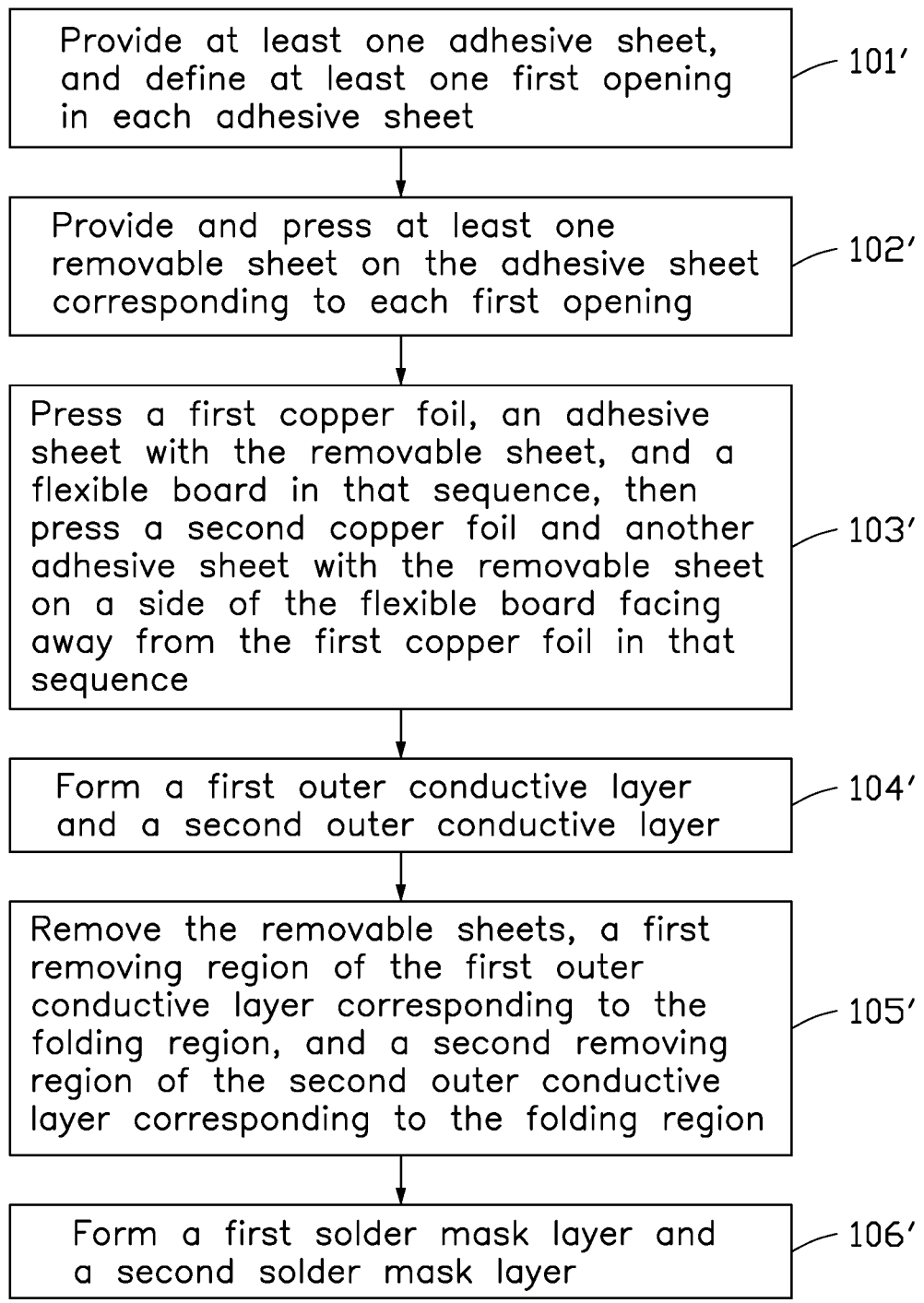
FIG. 8 is a flowchart of another embodiment of a method for manufacturing a rigid-flexible circuit board.

At block 106, referring to FIG. 7, a first solder mask layer 70 is formed on a side of the first outer conductive layer 31 facing away from the flexible board 40, and a second solder mask layer 72 is formed on a side of the second outer conductive layer 51 facing away from the flexible board 40, thereby covering the first outer conductive layer 31, the second outer conductive layer 51, and the conductive hole. A first electromagnetic interference shielding layer 73 is formed between the first outer conductive layer 31 and the folding region 403, and a second electromagnetic interference shielding layer 74 is formed between the second outer conductive layer 51 and the folding region 403. The first electromagnetic interference shielding layer 73 and the second electromagnetic interference shielding layer 74 are in close contact with the step 15 and the extending portion 16.

In another embodiment, a number of the adhesive sheet 10 is only one, and only one side of the flexible board 40 is connected a copper foil with the adhesive sheet 10.

In another embodiment, at block 103', a first copper foil 30, an adhesive sheet 10 with the removable sheet 20, and a flexible board 40 are pressed together in that sequence. A second copper foil 50 and another adhesive sheet 10 with the removable sheet 20 are then pressed on a side of the flexible board 40 facing away from the first copper foil 30 in that sequence.

In another embodiment, the block 106 can be omitted.

In another embodiment, the block 101 to 105 can be repeated to form a multilayer rigid-flexible circuit board.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing rigid-flexible circuit board comprising:

providing an adhesive sheet defining at least one first opening, a copper foil, and a flexible board, the flexible board comprising a mounting region and a folding region connected to each other;

pressing a removable sheet on a pressed surface of the adhesive sheet corresponding to each of the at least one first opening, to cause each removable sheet to cover each of the at least one first opening;

pressing the copper foil, the adhesive sheet with the removable sheet, and the flexible board in that sequence; wherein the removable sheet corresponds to the folding region, and is embedded in the adhesive sheet; the copper foil contacts with the pressed surface and the removable sheet; an area of the adhesive sheet contacting with the removable sheet concaves to form a step, and the adhesive sheet is softened and flows from the step to a center of the first opening to form an extending portion; an interspace is formed between the removable sheet and the flexible board;

forming an outer conductive layer on the copper foil, thereby the outer conductive layer, the adhesive sheet with the removable sheet, and the flexible board forming a middle structure; and removing a removing region of the outer conductive layer corresponding to the folding region and the removable sheet from the middle structure, thereby defining at least one second opening to expose the folding region and the step, and obtaining the rigid-flexible circuit board.

2. The method of the claim 1, wherein after pressing the copper foil, the adhesive sheet with the removable sheet, and the flexible board in that sequence, the method further comprising a step of providing another adhesive sheet with another removable sheet and another copper foil, and pressing the another copper foil and the another adhesive sheet with the another removable sheet on the flexible board in that sequence, two adhesive sheets being connected to two opposite sides of the flexible board, respectively.

3. The method of the claim 1, wherein before pressing the copper foil, the adhesive sheet with the removable sheet, and the flexible board in that sequence, the method further comprising a step of providing another adhesive sheet with another removable sheet and another copper foil; and pressing the copper foil, the adhesive sheet with the another removable sheet, and the flexible board in that sequence, further comprising two adhesive sheets being connected to two opposite sides of the flexible board, respectively.

4. The method of the claim 1, wherein each removable sheet comprises a plastic base and an adhesive film, the plastic base comprises a first surface and a second surface facing away from the first surface, the adhesive film is formed on the first surface, and pressing a removable sheet on a pressed surface of the adhesive sheet corresponding to each of the at least one first opening, further comprising the second surface contacting with the adhesive sheet.

5. The method of the claim 4, wherein the plastic base is made of polyimide polyethylene terephthalate or polyethylene naphthalate.

6. The method of the claim 1, wherein the adhesive sheet is a fiberglass-reinforced semi-cured adhesive sheet.

7. The method of the claim 1, wherein after removing a removing region of the outer conductive layer corresponding to the folding region and the removable sheet from the middle structure, the method further comprising a step of covering a solder mask layer on a side of the outer conductive layer facing away from the flexible board, and forming an electromagnetic interference shielding layer between the outer conductive layer and the folding region.

8. The method of the claim 1, wherein pressing a removable sheet on a pressed surface of the adhesive sheet corresponding to each of the at least one first opening, further comprising a nearest distance between a periphery of the removable sheet and an inner wall of the corresponding first opening being about 0.5 mm.

9. The method of the claim 1, wherein the removable sheet is pressed on the pressed surface of the adhesive sheet corresponding to each of the at least one first opening at 70 degrees Celsius.

10. The method of the claim 1, wherein a thickness of each removable sheet is less than a thickness of the adhesive sheet.

\* \* \* \* \*